United States Patent [19]
Yamane et al.

[11] Patent Number: 5,858,587
[45] Date of Patent: Jan. 12, 1999

[54] POSITIONING SYSTEM AND METHOD AND APPARATUS FOR DEVICE MANUFACTURE

[75] Inventors: Yukio Yamane, Tokyo; Eiji Osanai, Yokohama; Kotaro Akutsu, Sohka, all of Japan

[73] Assignee: Canon Kabushiki Kaisha, Tokyo, Japan

[21] Appl. No.: 602,460

[22] Filed: Feb. 16, 1996

[30] Foreign Application Priority Data

Feb. 24, 1995 [JP] Japan ................................. 7-036946

[51] Int. Cl.⁶ ........................................................ G03F 9/00
[52] U.S. Cl. .............................................. 430/22; 355/53
[58] Field of Search ........................... 430/22, 5; 384/9; 108/143; 356/401; 355/53

[56] References Cited

U.S. PATENT DOCUMENTS

| | | | |
|---|---|---|---|
| 4,698,575 | 10/1987 | Bouwer | 318/640 |
| 4,869,481 | 9/1989 | Yabu et al. | 269/21 |
| 5,040,431 | 8/1991 | Sakino et al. | 74/479 |
| 5,184,055 | 2/1993 | Ohishi et al. | 318/615 |
| 5,280,677 | 1/1994 | Kubo et al. | 33/568 |
| 5,376,988 | 12/1994 | Osanai | 355/53 |
| 5,382,095 | 1/1995 | Akutsu | 384/100 |
| 5,440,397 | 8/1995 | Ono et al. | 356/401 |
| 5,671,058 | 9/1997 | Kawaguchi | 356/401 |

FOREIGN PATENT DOCUMENTS 63-232912  9/1988  Japan.

OTHER PUBLICATIONS

Review of Scientific Instruments, Jul., 1987, USA, vol. 58, No. 7, pp. 1303–1305, Greene, G.L., "Accurate positional servo for use with pneumatically supported masses and vibrationally isolated tables", *abstract*.

Patent Abstracts of Japan, vol. 014, No. 502 (E–0997), published 2 Nov. 1990, English Abstract of Japanese Patent No. 02–207520, Aug. 17, 1990, *abstract*.

Primary Examiner—S. Rosasco
Attorney, Agent, or Firm—Fitzpatrick, Cella, Harper & Scinto

[57] ABSTRACT

A positioning system wherein a holding surface for holding a substrate is movable relative to a base in directions of X, Y and Z axes and in rotational directions about the X, Y and Z axes, wherein there are plural guiding devices associated respectively with motions in the directions of X, Y and Z axes and in the rotational directions about the X, Y and Z axes, respectively, and wherein each guiding device comprises a non-contact static bearing device.

12 Claims, 10 Drawing Sheets

POSITIONING SYSTEM AND METHOD AND APPARATUS FOR DEVICE MANUFACTURE

FIELD OF THE INVENTION AND RELATED ART

This invention relates to a positioning system and, more particularly, to a positioning system for use in an exposure apparatus for forming a pattern on a planar member or substrate, such as a semiconductor wafer or a liquid crystal panel, for example. According to another aspect, the invention is concerned with a method and apparatus for device manufacture, such as an exposure method and apparatus, by which, in a process of the manufacture of microdevices, such as high-density integrated circuit chips (e.g., semiconductor memories or computing units), for example, the attitude or tilt of an object to be exposed, such as a wafer on which a circuit pattern or the like is to be printed, is correctly maintained, whereby high precision exposure is assured.

Exposure apparatuses such as those called steppers, by which a pattern of a mask or reticle, for the manufacture of semiconductor devices, is projected onto a wafer, are usually equipped with a function for attaining alignment of the reticle and the wafer. The exposure process is performed after the alignment process using that function. Generally, in such alignment process, a deviation between an original (such as a reticle) having a pattern to be transferred and an object to be exposed, such as a wafer (substrate), is first measured. Then, on the basis of the result of measurement and through the control based on measurement by a laser measurement device, the object to be exposed (substrate) is moved through step-and-repeat motion or, alternatively, both of the original and the object to be exposed are moved.

Step-and-repeat type steppers or step-and-scan type steppers should have a performance by which a wafer stage (substrate stage), which is movable while holding a wafer or substrate to be exposed thereon, can be positioned very precisely. This performance is required from the point of resolution and registration precision of the stepper itself. Also, further improvements in quick positioning operation have recently been desired, for further enhancement of the productivity.

FIG. 15 is a perspective view of a wafer stage of known type, to be used in an exposure apparatus. Denoted in the drawing at 155 is a base on which a Y stage (Y-direction movement mechanism) 154 is mounted. Mounted on the Y stage 154 is an X stage (X-direction movement mechanism) 151. The Y stage and the X stage are components of an X-Y stage. Mounted on the X stage 151 is a top stage (θ-Z-T stage) $E_0$ on which mirrors 191a and 191b are placed. Measurement laser axes 192a and 192b from laser interferometers are projected on these mirrors 191a and 191b, respectively, for measurement of the position with respect to the direction of the X and Y axes.

On the basis of the result of this laser measurement, DC motor 156a or 156b is actuated to drive the X stage 151 or Y stage 154 through a ball screw 157a or 157b. Usually, each stage is guided by a guide comprising a roller ball bearing, not shown. FIGS. 16 and 17 are a top plan view and a sectional view of the θ-Z-T stage $E_0$, wherein the mirrors 191a and 191b are unshown.

As illustrated in these drawings, the θ-Z-T stage $E_0$ includes a disk-like holding plate (θ-Z-T plate) 104 having a wafer chuck 111 with a surface for attracting thereto a substrate such as a semiconductor wafer through vacuum attraction. This holding plate 104 is supported on the X stage 151 by means of a plurality of (three, for example) piezoelectric devices 105. Each piezoelectric device 105 has an end resiliently connected to a ring-like member 103, juxtaposed to the outside circumferential edge of the holding plate 104. The other end of the piezoelectric device 105 is resiliently connected to the X stage 151 (which functions as a top plate) through a resilient hinge 105. The holding plate 104 and the ring-like member 103 are resiliently connected to each other through a plurality of (four, for example) leaf springs 103a. Also, plural supporting members 102, which are integral with the top plate 151, are resiliently connected to the outside circumferential edge of the ring-like member 103 by means of a plurality of (three, for example) leaf springs 103b.

The piezoelectric devices 105 are adapted to be expanded or contracted, individually, in response to drive currents supplied thereto, to thereby shift the holding plate 104 toward or away from the top plate 151 and, additionally, to thereby change the relative tilt angle between them. Further, the holding plate 104 has a projection arm 104a extending through an opening 103c of the ring-like member 103, radially outwardly of it. There is a piezoelectric device 106 between the projection arm 104a and another projection arm 103d, which is provided on the ring-like member 103. Expansion or contraction of this piezoelectric device 106 causes relative rotational motion between the holding plate 104 and the ring-like member 103.

The holding plate 104 is moved reciprocally along an axis (Z axis) perpendicular to the surface of the top plate 151, in response to driving the piezoelectric devices 105 by the same amounts. By changing the amounts of drive of the piezoelectric devices individually, the tilt angle (inclination) with respect to a plane perpendicular to the Z axis can be adjusted. Also, the angle of rotational motion about the Z axis is adjustable by actuating the piezoelectric device 106. By means of fine-motion adjustment such as described above, focusing and final positioning of the wafer as held by the wafer chuck 111 can be performed.

SUMMARY OF THE INVENTION

In the structure such as described above, there is a possibility that, if the resolving power of the laser interferometer is enlarged or the rotation speed of the DC motor is increased so as to attain higher precision of or higher speed of the X-Y stage, the top plate (X stage) 151 is deformed due to friction or a reactive force in the motion, which causes degradation of precision. Also, there may occur abrasion, due to friction, of portions being in contact with each other, which produces much dust or a lot of particles. On the other hand, the precision itself changes and, therefore, there is a necessity of frequent maintenance operations.

As regards the θ-Z-T stage $E_0$, the connection between the holding plate 104 and the ring-like member 103 and the connection between the ring-like member 103 and the supporting member 102, which is integral with the top plate 151, are based on the leaf springs 103a and 103b, respectively. Because of this structure, if the drive amounts of the piezoelectric devices 105 are large, the ring-like member 103 or the supporting member 102 may deform, like the top plate 151, due to the reactive force of the leaf springs 103a or 103b. Such deformation may cause degradation of the positioning precision.

It is accordingly an object of the present invention to provide a positioning system by which a high speed positioning operation is assured without coupling of vibrations during the motion or without the production of a large vibration, by which good position reproducibility is assured without large friction or abrasion, and by which high precision and stable positioning operation is assured without the necessity of any or frequent maintenance operations.

It is another object of the present invention to provide a device manufacturing method and/or apparatus which is based on a positioning system such as described above.

In accordance with an aspect of the present invention, there is provided a positioning system wherein a holding surface for holding a substrate is movable relative to a base in directions of X, Y and Z axes and in rotational directions about the X, Y and Z axes, respectively, characterized in that: there are plural guiding means associated respectively with motions in the directions of X, Y and Z axes and in the rotational directions about the X, Y and Z axes, respectively, wherein each guiding means comprises non-contact static bearing means.

In one preferred form of this aspect of the present invention, the static bearing means comprises a porous throttling type bearing.

According to another preferred form of this aspect of the present invention, there are plural driving means associated respectively with motions in the directions of X, Y and Z axes and in the rotational directions about the X, Y and Z axes, respectively, wherein each driving means comprises a linear motor.

According to a further preferred form of this aspect of the present invention, the positioning system comprises an X-Y stage and a θ-Z-T stage disposed between the holding surface and the base, wherein said X-Y stage is movable in the directions of X and Y axes and wherein the θ-Z-T stage is mounted on the X-Y stage and is movable in the direction of Z axis and in the rotational directions about the X, Y and Z axes.

According to a further preferred form of this aspect of the present invention, those of the plural guiding means which are associated respectively with motions in the direction of the Z axis and in the rotational directions about the X, Y and Z axes, respectively, comprise cylindrical static bearings, respectively.

In a further preferred form of this aspect of the present invention, the θ-Z-T stage is provided with driving means which comprises at least three actuating elements supported by said X-Y stage.

In a further preferred form of this aspect of the present invention, the X-Y stage comprises (i) a Y stage movable along a Y-axis static guiding surface provided on the base, (ii) Y-stage driving means for moving the Y stage, (iii) an X stage movable with the Y stage and movable along an X-axis static guiding surface provided on the Y stage, and (iv) X-stage driving means for moving the X stage, wherein the X stage and the Y stage are supported, individually, on the base by static bearing means, with respect to the direction of the Z axis.

In a further preferred form of this aspect of the present invention, the static bearing means has a guiding surface with a surface roughness not greater than 1s (1 micron).

In a further preferred form of this aspect of the present invention, the static bearing means comprises a porous material having a permeability not greater than $5 \times 10^{-16}$ and a porosity coefficient not greater than 20%.

In accordance with another aspect of the present invention, there is provided a device manufacturing apparatus or a semiconductor device manufacturing apparatus which may have at least one of the features of the positioning system described above.

In accordance with a further aspect of the present invention, there is provided a device manufacturing method or a semiconductor device manufacturing method which may have at least one of the features of the positioning system described above.

In accordance with the present invention, the guiding of motions along six axes (directions) may be all provided by non-contact static gas bearing means. This effectively and substantially avoids friction or abrasion and, thus, assures very good position reproducibility. High precision and stable positioning operation is thus attainable.

The non-contact guide is also effective to substantially avoid the problem of dust production. Also, because of abrasion free, there does not occur a substantial change with time. This eliminates or substantially eliminates the necessity of maintenance operation. Thus, a reliable and maintenance free positioning system is provided.

Additionally, there is no possibility of large vibration in the operation of the positioning system. Thus, the speed of the positioning operation can be enlarged easily. Irrespective of the magnitude of the driving amount, good positioning precision is retained. This facilitates high precision pattern printing operation in a semiconductor device manufacturing exposure apparatus.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
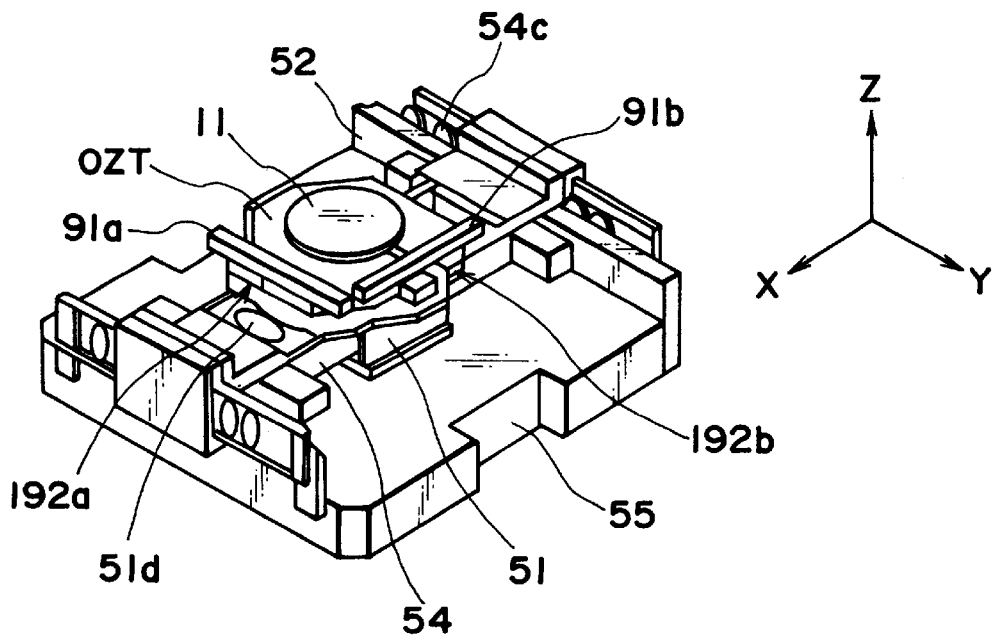
FIG. 1 is a perspective view of a positioning system according to an embodiment of the present invention, which can be incorporated into a semiconductor device manufacturing exposure apparatus.

The invention will hereinafter be explained with reference to the preferred embodiments illustrated in the drawings. FIGS. 1–14 show embodiments of the present invention, which are applied to a six-axis stage for movement of a semiconductor wafer, in a projection exposure apparatus of step-and-repeat type or step-and-scan type, for manufacture of semiconductor devices.

FIG. 1 is a perspective view of a six-axis wafer stage according to an embodiment of the present invention. In this embodiment, the wafer stage comprises a static X-Y stage having an X stage 51 on which a four-axis static θ-Z-T stage $E_1$ is mounted. Denoted in the drawing at 55 is a stage base, and denoted at 54 is a Y stage. Denoted at 51 is the X stage. FIGS. 2–7 show details of this X-Y stage.

Figure 2:
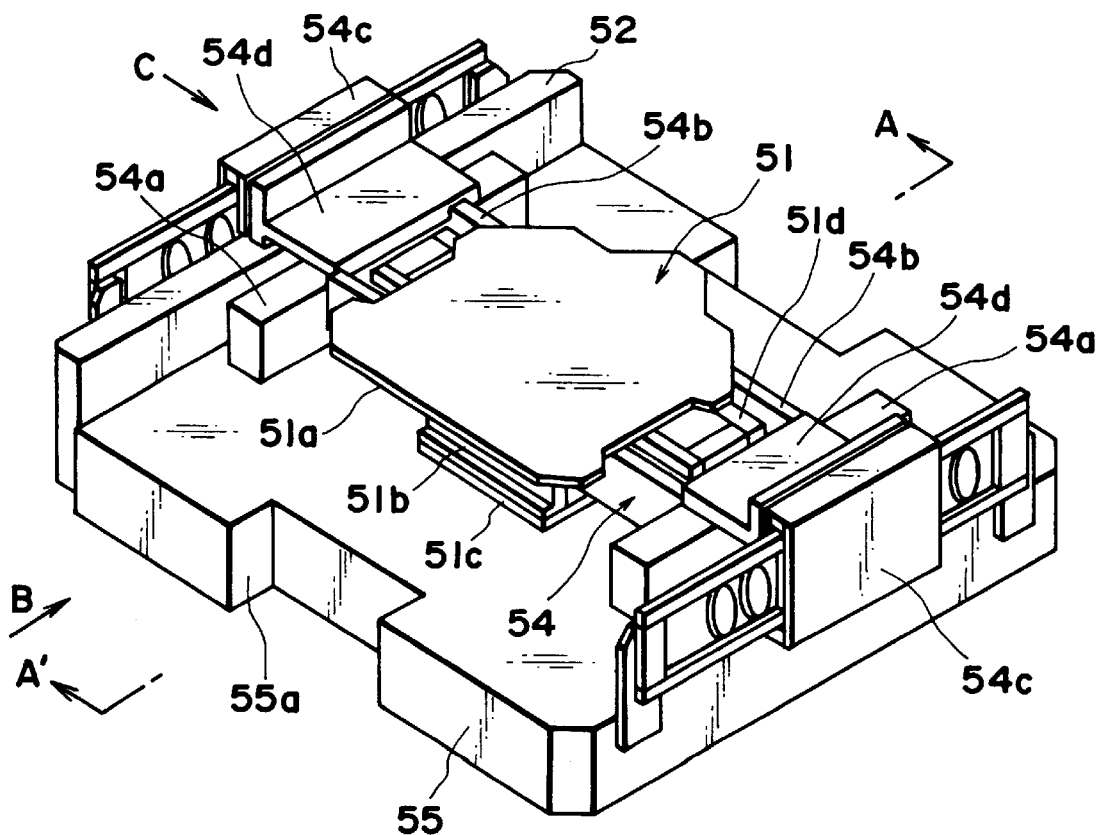
FIG. 2 is a perspective view of an X-Y stage, in an embodiment of the present invention.
Figure 3:
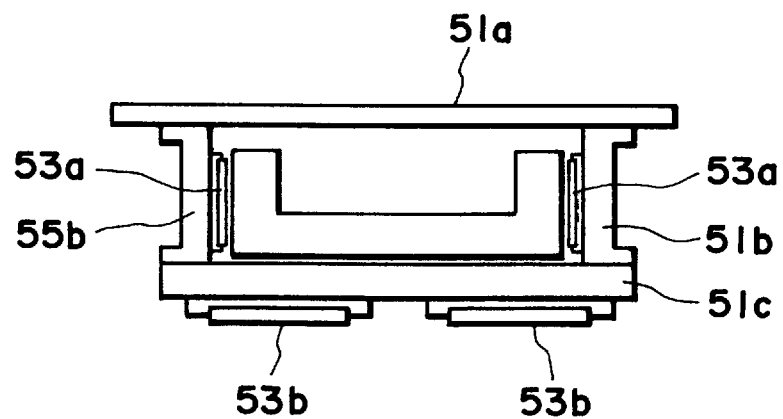
FIG. 3 is a sectional view of the X-Y stage, taken along a line A—A' in FIG. 2.
Figure 4:
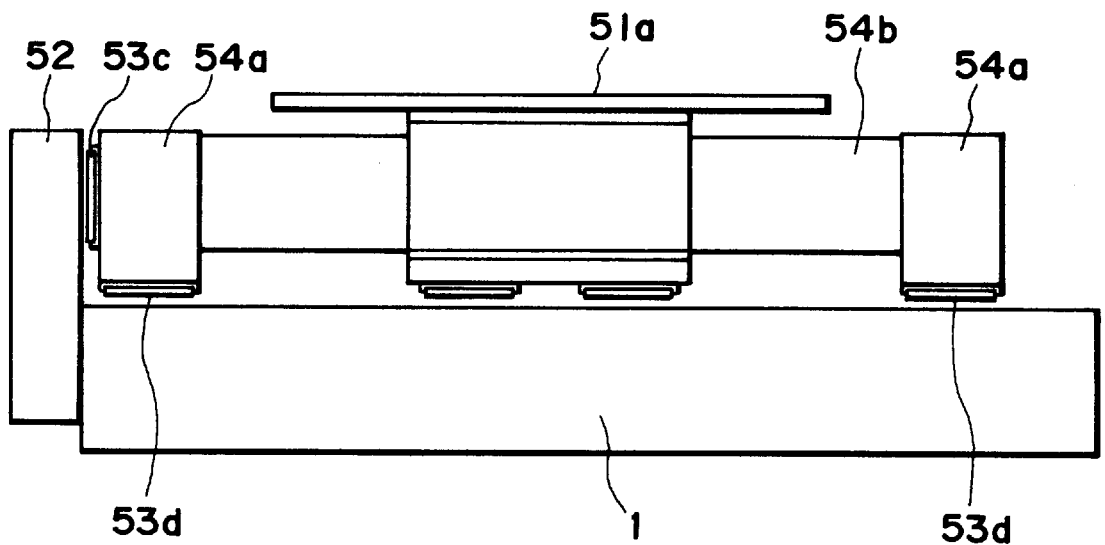
FIG. 4 is a side view of the X-Y stage, as viewed in the direction of an arrow B in FIG. 2.
Figure 5:
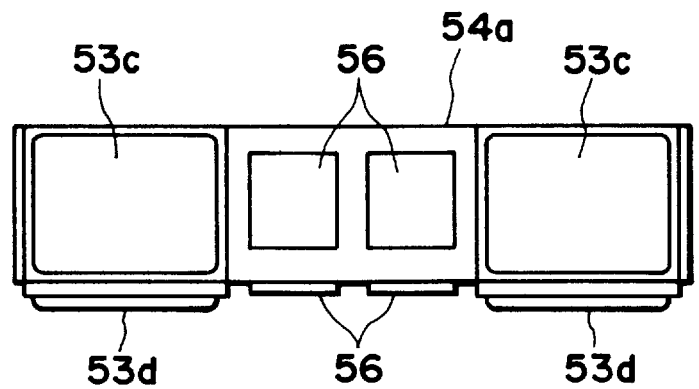
FIG. 5 is a side view of the X-Y stage, as viewed in the direction of an arrow C in FIG. 2.
Figure 6:
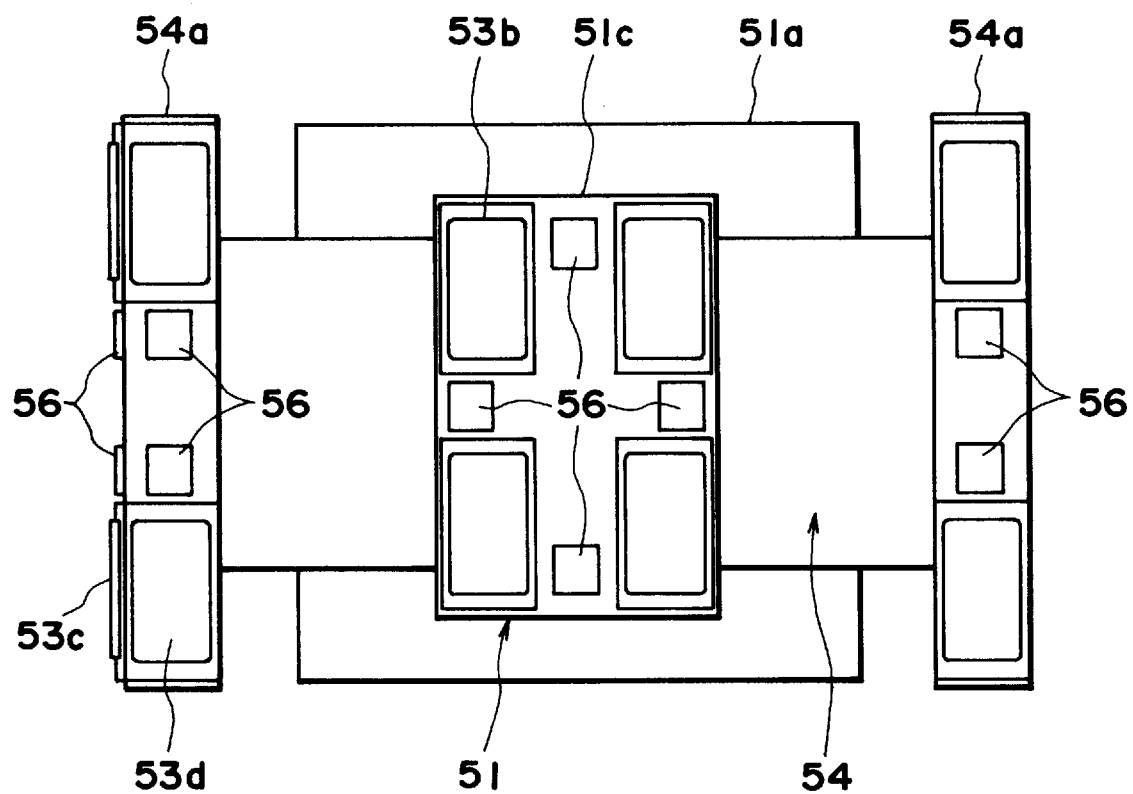
FIG. 6 is a bottom view of an X-Y stage, in another embodiment of the present invention.

FIG. 2 is a perspective view of the X-Y stage, and FIG. 3 is a sectional view taken on line A—A' in FIG. 2. FIG. 4 is a side view, as viewed in the direction of an arrow B in FIG. 2, and FIG. 5 is a side view, as viewed in the direction of an arrow C in FIG. 2. FIG. 6 is a bottom view of the X-Y stage of FIG. 2.

In FIG. 2, denoted at 55 is the base whose upper surface provides a reference surface. Denoted at 55a is a recess provided for maintenance of bearing means. Denoted at 54 is a Y stage (movable member), and denoted at 51 is an X stage (movable member). Denoted at 52 is a fixed guide for the motion of the Y stage 54 in a horizontal direction (direction of Y axis). Denoted at 53a, 53b, 53c and 53d are static pressure gas bearing means, having porous materials. Of these static bearing means, the bearing means 53a (see FIG. 3) serves to guide the motion of the X stage 51 in a horizontal direction (direction of Y axis), and the bearing means 53b (FIG. 3) serves to guide the motion of the X stage 51 in a vertical direction (direction of Z axis). The bearing means 53c (see FIG. 4) serves to guide the motion of the Y stage 54 in a horizontal direction, and the bearing means 53d (FIG. 4) serves to guide the motion of the Y stage 54 in a vertical direction.

In FIG. 4, denoted at 54a are bearing mounts on which the static pressure gas bearings 53c and/or 53d for the motions of the Y stage 54 in the horizontal (or lateral) direction and/or in the vertical (or perpendicular) direction, are mounted. Denoted at 54b is a guiding plate for the motion of the X stage 51 in a horizontal direction.

Referring back to FIG. 2, denoted at 54c are driving actuators for moving the Y stage, and denoted at 54d are coupler plates for the driving actuators 54c of the Y stage 54. The coupler plates 54d are connected to the static bearing mounts 54a, respectively. Denoted at 51a is a movable plate of the X stage 51, and denoted at 51b are bearing mounts (see FIG. 3) on which the horizontal bearings 53a of the X stage 51 are mounted. Denoted at 51c is a bearing mount (FIG. 3) on which the vertical bearings 53b of the X stage 51 are mounted, and denoted at 51d is driving actuator means (FIG. 2) for the X stage 51.

In FIGS. 5 and 6, denoted at 56 are loading magnet units, respectively. Each magnet unit has a structure such as disclosed in Japanese Laid-Open Patent Application, Laid-Open No. 63-232912, wherein a loading mechanism having a permanent magnet (magnetic means) and yokes on both sides of the permanent magnet serves, when a pressurized fluid is supplied to a static pressure bearing to thereby float a movable member, to prevent tilt of the movable member due to dispersion in bearing characteristic to thereby maintain a constant attitude of the movable member. In this embodiment, the driving actuator means 51d or 54c uses a linear motor or a hydraulic DC motor, for example.

As shown in FIG. 2, the Y stage 54 is floated above the base 55 in response to the supply of gases or airs to the static bearings 53c and 53d. Also, by means of the two driving actuators 54c disposed at the opposite sides of the Y stage, it is moved in the Y direction along the fixed guide 52 which is disposed at one side thereof. As regards the X stage 51, it is floated above the base 55 in response to the supply of gases to the static gas bearings 53a and 53b, as in the case of the Y stage 54. Also, by means of the driving actuator means 51c, it is moved in the X direction while being guided by a horizontal guide as provided by the side face 54b of the Y stage. Here, the X stage 51 and the Y stage 54 are adjusted by the plural loading magnet units 56 so as to keep a constant attitude, stably.

The X-Y stage mechanism of the present invention as described above, has the following features:

(a) The guiding of the X stage 51 and the Y stage 54 with respect to the vertical direction is all provided by the base 55. Thus, the motion of one of the X stage 51 and the Y stage 54 does not produce a movement load in the other, such that the static attitude can be kept satisfactorily.

(b) There occurs no coupling of vibrations of the Y stage 54 in respect to three components in the horizontal direction (X-axis direction), vertical direction (Z-axis direction) and rolling (rotational direction about the Y axis).

(c) Pitching of the Y stage 54 (in the rotational direction about the X axis) is transmitted to the X stage through the static gas bearing means 53d only. This minimizes the coupling.

(d) Owing to the above, it is possible to provide the fixed guide 52, the Y stage 54 and the X stage 51 by using different materials having different thermal expansion coefficients. For example, the base 55 and the fixed guide 52 may be made of a magnetic material, for magnetic loading, while the Y stage 54 and the X stage 51 may be made of ceramics, for example, for reduction in weight and higher rigidity. In that case, since only one fixed guide 52 is used and only one face is used as a reference, there does not occur a change in characteristic due to a temperature difference.

(e) Since the base 55 is provided with the recess 55a, even if foreign particles are adhered to the bearing mount 51d for vertical bearings of the X stage 51, it is easy to clean the mount by moving the X stage 51 to a position below the recess.

(f) The bearing mount 51b for the horizontal bearings of the X stage 51 may have a channel shape such as shown in FIG. 3. This increases the contact area of components, and it effectively improves the stability to relative shift of connected portions.

(g) The fixed guide 52 is laterally fixed to the base 55, and this prevents lateral shift of the fixed guide 52.

Figure 7:
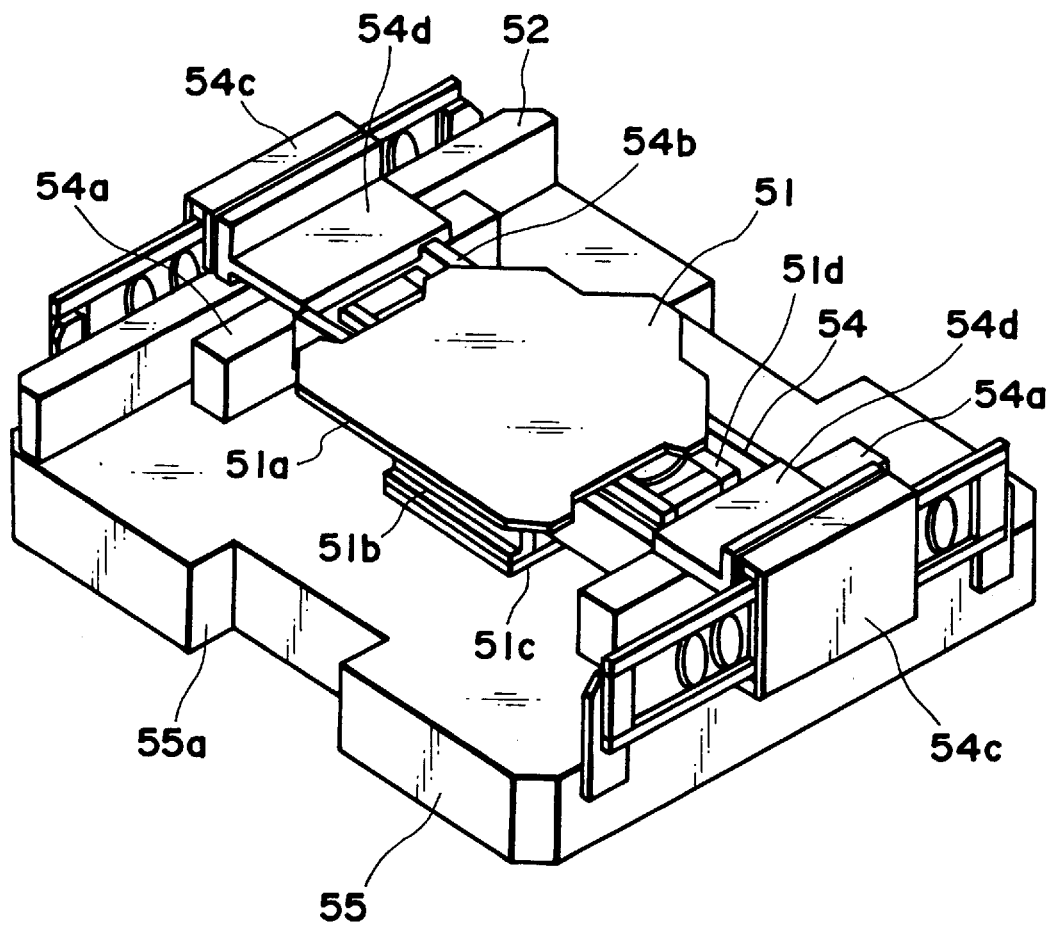
FIG. 7 is a perspective view of an X-Y stage, in a further embodiment of the present invention.

FIG. 7 is a perspective view of an X-Y stage mechanism, in another embodiment of the present invention. In this embodiment, the elements corresponding to those of the preceding embodiment are denoted by corresponding reference numerals. In the embodiment of FIG. 7, a fixed guide 52 is mounted on the top face of a base 55 by using fixing means (not shown) such as pin fixation or adhesion, for example. This embodiment has the same features (a)–(e) described above. Additionally, since there is no necessity of machining and precision finishing of the fixed guide mounting surface (side face) of the base 55 of FIG. 2, reduction of cost is attainable. Also, the height of the fixed guide 52 can be made small, and sufficient rigidity can be kept even by a reduction in thickness.

Now, referring to FIGS. 8–14, details of a four-axis static θ-Z-T stage to be placed on an X stage of a static X-Y stage, will be explained.

Figure 8:
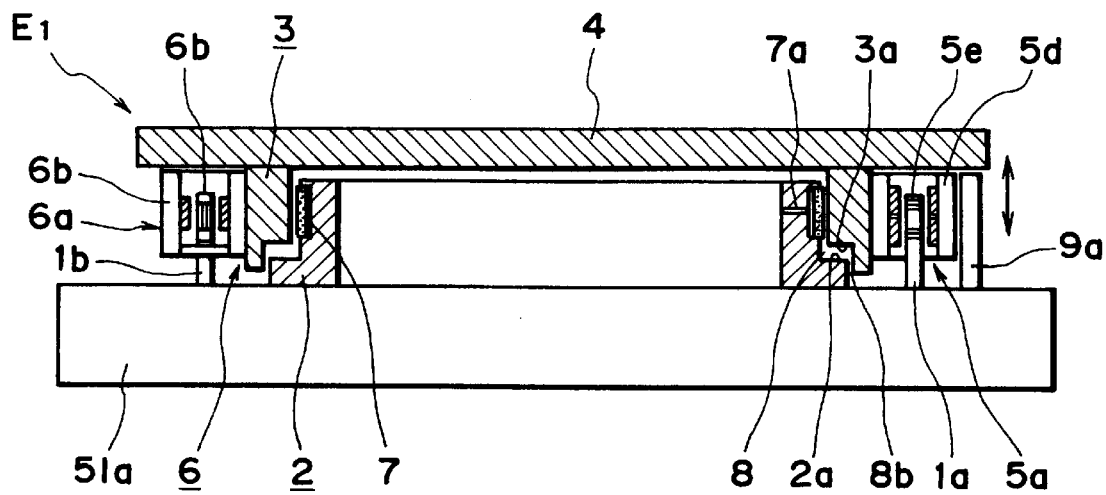
FIG. 8 is a sectional view of a θ-Z-T stage, in an embodiment of the present invention, wherein the section is taken along a line A-B in FIG. 10 to be described later.

FIG. 8 is a longitudinal section of a four-axis θ-Z-T stage in an embodiment of the present invention, the section being taken in the direction of Z axis.

The four-axis θ-Z-T stage $E_1$ of this embodiment comprises an X top plate 51a of the X stage 51 as described hereinbefore, a fixed member (supporting means) 2 of cylindrical shape, being provided integrally with the top plate 51a. The θ-Z-T stage further comprises a guiding member 3 of cylindrical shape, loosely fitted around the outside circumferential surface (supporting surface) of the fixed member 2b, and a holding plate 4 integrally connected to an upper end of the guiding member 3 as viewed in the drawing. The θ-Z-T stage further comprises three Z linear motors (driving means) 5a, 5b and 5c (see FIG. 10) for moving the holding plate 4 toward or away from the X top plate 51a of the X stage 51, and one θ linear motor (driving means) 6 (FIG. 10) for rotationally moving the holding plate 4 relative to the X stage 51. A wafer, not shown, can be attracted to the surface of the holding plate 4 through vacuum attraction.

The outside circumferential surface of the fixed member 2 and the inside circumferential surface (guiding surface) of the guiding member 3 are relatively supported without mutual contact, by means of static pressures of pressurized fluids as discharged from a porous material pad 7 of a ring-like static pressure bearing which is held at the outside circumferential surface of the fixed member 2. This static bearing comprises a porous throttling type gas bearing. Thus, the holding plate 4 is movable reciprocally along the Z axis, which is the central axis both for the fixed member 2 and the guiding member 3, and also the holding plate 4 is movable rotationally about the Z axis. It is to be noted here that, by enlarging the size of the porous pad 7 in the Z-axis direction, the tolerance for the tilt angle of the holding plate with respect to the Z axis can be enlarged. Also, most of the weight of the guiding member 3 and the holding plate 4 as well as a wafer attracted to the holding plate, is supported by the pressure of a pressurized fluid within a loading chamber (applying means) 8, which is defined by a step 2a formed on the fixed member 2, and another step 3a formed on the guiding member 3.

Figure 9:
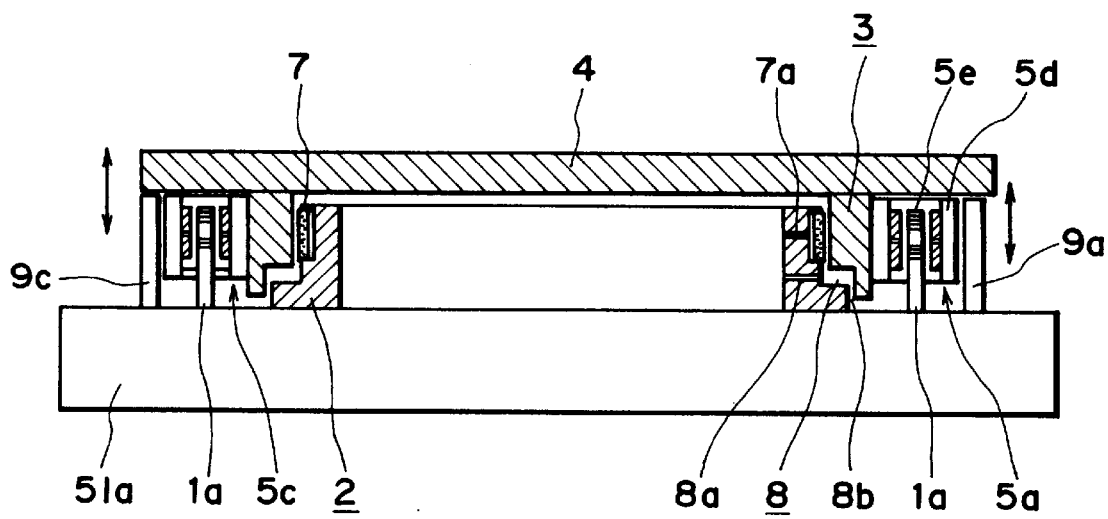
FIG. 9 is a sectional view of the θ-Z-T stage of the FIG. 8 embodiment, wherein the section is taken along a line A-C in FIG. 10.

As shown in FIG. 9, the guiding member 3 has inside flow passageways 7a and 8a for supplying pressurized fluids to the porous pad 7 and the loading chamber 8. Between the fixed member 2 and the lower end of the guiding member 3 as viewed in the drawing, a labyrinth seal 8b is formed. The size of the clearance between the porous pad 7 and the guiding member 3 is about 7 microns, and the clearance size of the labyrinth seal 8b is approximately 15 microns.

Figure 10:
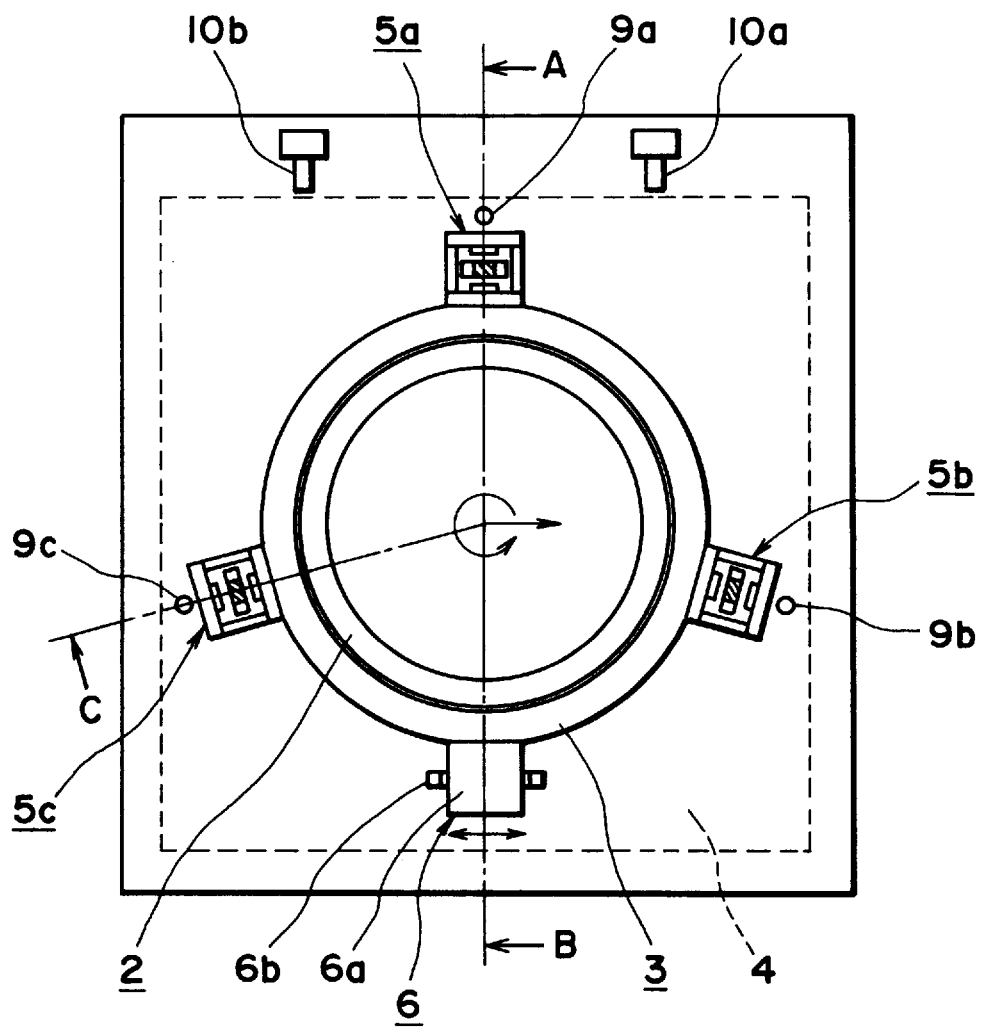
FIG. 10 is a schematic top plan view of the θ-Z-T stage of the embodiment of FIGS. 8 and 9, wherein a holding plate is demounted.

The Z linear motors 5a, 5b and 5c are disposed along a circumferential direction, outside the guiding member 3, equidistantly as shown in FIG. 10. The linear motors 5a–5c have movable elements 5d each comprising a cylindrical frame member having a permanent magnet on the inside face thereof. This frame member is fixedly mounted to the outside circumferential surface of the guiding member 3. The linear motors 5a–5c further comprises stationary elements 5c each comprising a coil fixedly mounted to the X top plate 51a of the X stage 51. Through wirings, not show, these coils are connected to predetermined driving circuit means, such that each movable element 5d can be driven in the Z-axis direction in accordance with the magnitude of an electric current supplied from the driving circuit means.

If electric current s of the same magnitude are supplied to the Z linear motors 5a–5c, the holding plate 4 moves in the Z-axis direction while maintaining its inclination. By changing the magnitudes of electric currents to be supplied to the Z linear motors 5a–5c individually, it is possible to change the inclination of the holding plate 4, that is, the tilt angle thereof with respect to the Z axis.

The θ linear motor 6 shown in FIG. 10 is disposed between two desired ones of the Z linear motors 5a–5c. It has a movable element 6a of cylindrical frame member having a permanent magnet on the inside face thereof. This frame member is fixedly mounted on the outside circumferential surface of the guiding member 3. The θ0 linear motor 6 further comprises a stationary element 6b which comprises a coil member being fixed to the X top plate 51a which is integral with the X stage 51. Through wirings not shown, it is connected to predetermined driving circuit means, such that the movable element 6b can be driven in the circumferential direction of the holding plate 4 in accordance with the magnitude of an electric current supplied from the driving circuit means. This causes rotational motion of the holding plate 4 about the Z axis.

Non-contact type displacement sensors 9a, 9b and 9c are disposed on the X top plate 51a, in juxtaposition with the linear motors 5a–5c. Each displacement sensor 9a, 9b or 9c has a detection end disposed opposed to the bottom surface of the holding plate 4 as viewed in FIG. 8, and each displacement sensor serves to detect a change in position of the holding plate 4 with respect to the Z-axis direction. Also, there are a pair of non-contact type displacement sensors 10a and 10b which are mounted on the X top plate 51a and are disposed opposed to the one side edge of the holding plate 4. On the basis of a difference between their outputs, the displacement sensors 10a and 10b serve to detect an angle of rotation of the holding plate 4 about the Z axis. The outputs of the displacement sensors 9a–9c and of the displacement sensors 10a and 10b may be fed back to the driving circuit means described hereinbefore and, by doing so, the fine-motion positioning of the holding plate 4 can be automated.

In this embodiment, the Z linear motors 5a–5c and the θ linear motor 6 are supported on the X top plate 51a, independently of each other. Also, the holding plate 4 and the X top plate 51 are held in a non-contact relation. Thus, there is no possibility of large vibration during the motion of the holding plate 4. Further, since most of the weight of the holding plate and the wafer held thereby is supported by means of the loading chamber 8, only a small driving force is required for each of the Z linear motors 5a–5c and the θ linear motor 6.

If the inclination of the holding plate 4, that is, the tilt angle thereof with respect to the Z axis changes, it causes a change in the size of the bearing clearance of the porous pad 7 and in the clearance size of the labyrinth seal 8a as well as in the clearance size between the permanent magnet and the coil in each of the Z linear motors 5a–5c and the θ linear motor 6. However, in a positioning system for performing focus adjustment or final positioning in an exposure apparatus, such changes are very small. Thus, there would not arise problems of contact of the porous pad 7 with the guiding member 3, large degradation of the performance of the labyrinth seal 8 or much restriction to the driving amount of the linear motor.

Figure 11:
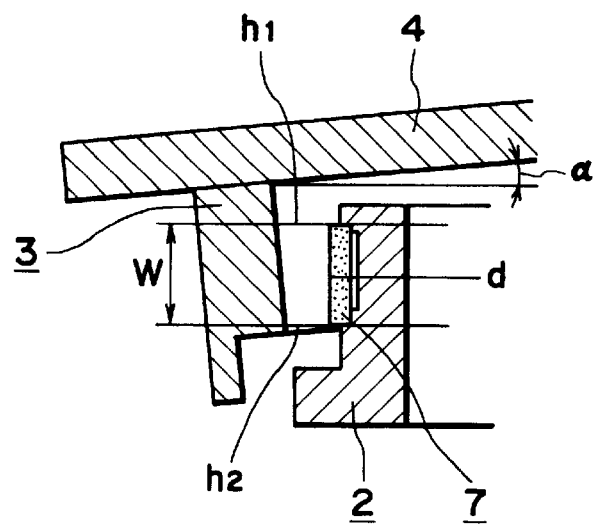
FIG. 11 is an enlarged sectional view of a main portion of the θ-Z-T stage of the FIG. 8 embodiment.

Generally, the minimum clearance of a linear motor is about 1–2 microns. When as shown in FIG. 11 the diameter of the bearing surface of the porous pad 7 is denoted by d, the size thereof in the Z-axis direction is denoted by w and the sizes at the opposite ends of the bearing clearance are denoted by h1 and h2, respectively, and if d=200 mm and w=20 mm and if the fine-motion adjustment amount α of the tilt angle of the holding plate 4 is $\alpha=3\times10^{-4}$ rad., then the amount of change "(h1–h2)/2" in the size of the bearing clearance is about 3 microns. Since, however, the set clearance size of the porous pad 7 is 7 microns and the set clearance size of the labyrinth seal is 15 microns, as described hereinbefore, problems such as are mentioned above do not arise. It is to be noted that the stroke length of the movable element of each linear motor can be 5 mm.

Figure 12:
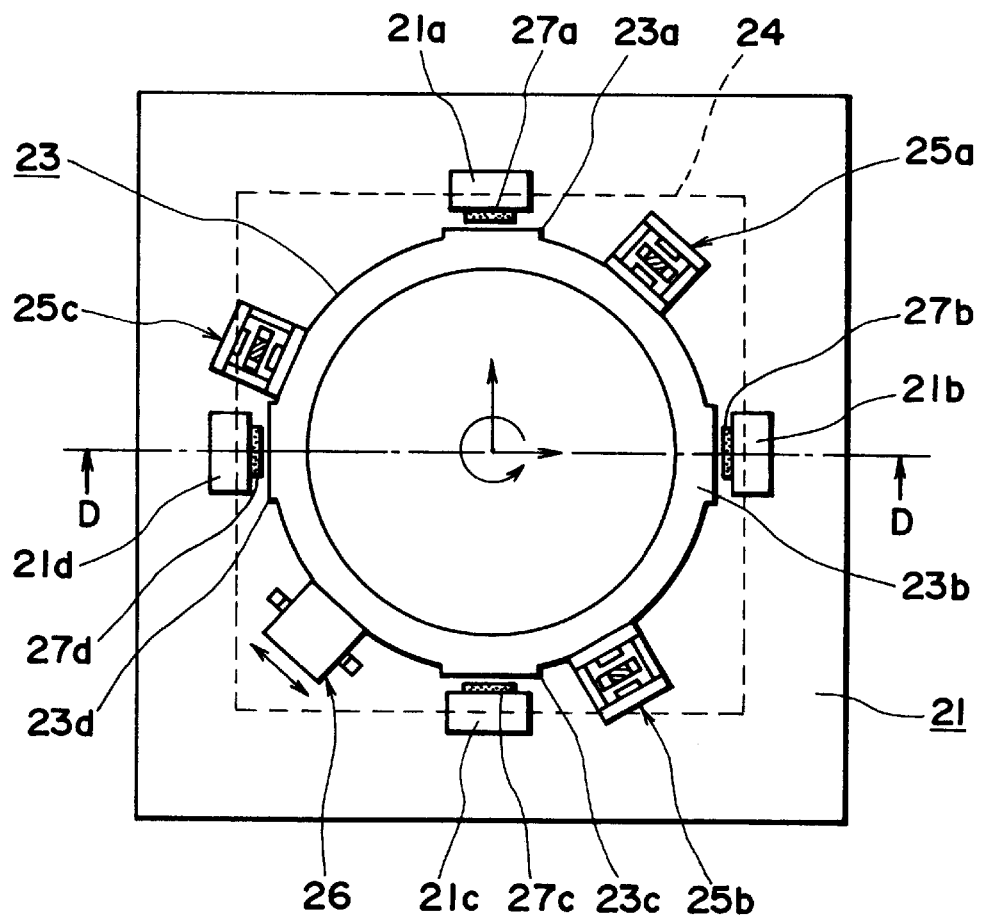
FIG. 12 is a schematic top plan view of a θ-Z-T stage, in another embodiment of the present invention, wherein a holding plate is demounted.
Figure 13:
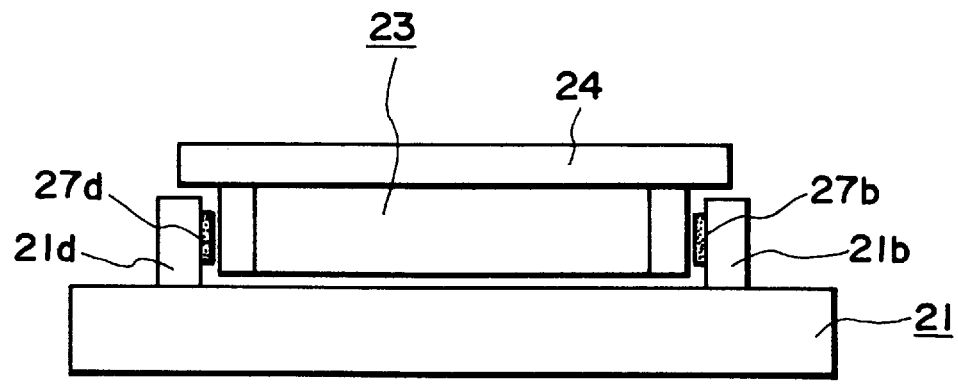
FIG. 13 is a sectional view of the θ-Z-T stage of FIG. 12, taken along a line D—D in FIG. 12.

FIGS. 12 and 13 show another embodiment of θ-Z-T stage. In this embodiment, in place of the cylindrical fixed member 2 of the preceding embodiment, X stage (X top plate) 21 is provided with four supports 21a–21d on which small porous material pads 27a–27d are held, respectively. The porous pads 27a–27d are disposed opposed to flat portions 23a–23d, respectively, which are formed on the outside circumferential surface of a guiding member 23 which is integral with a holding plate 24. Thus, the porous pads 27a–27d function to support the guiding member 23 in four directions, without contact thereto. In this embodiment, since the holding plate 24 has to be supported by driving forces of Z linear motors 25a–25c, causing Z-axis motion, the power consumption is larger than in the preceding embodiment. However, no loading chamber is necessary, and the assembling is easier.

Figure 14:
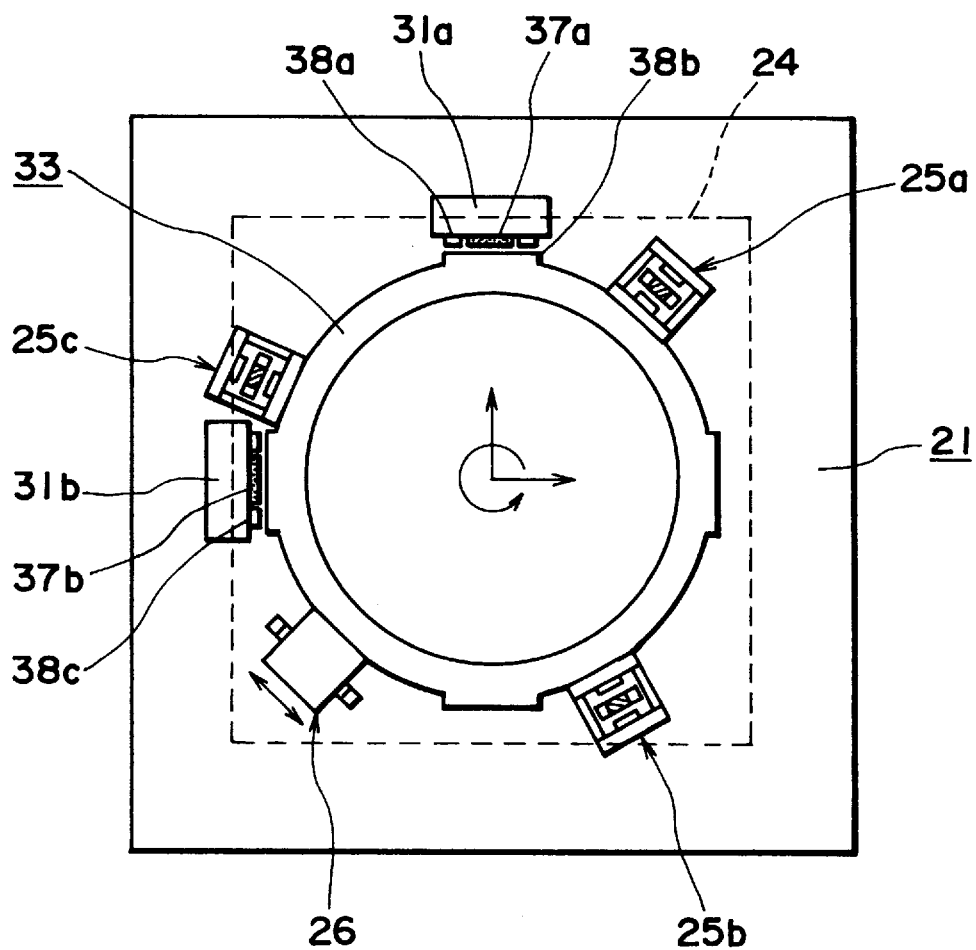
FIG. 14 is a schematic top plan view of a modified form of the θ-Z-T stage of the FIG. 12 embodiment, wherein a holding plate is demounted.
Figure 15:
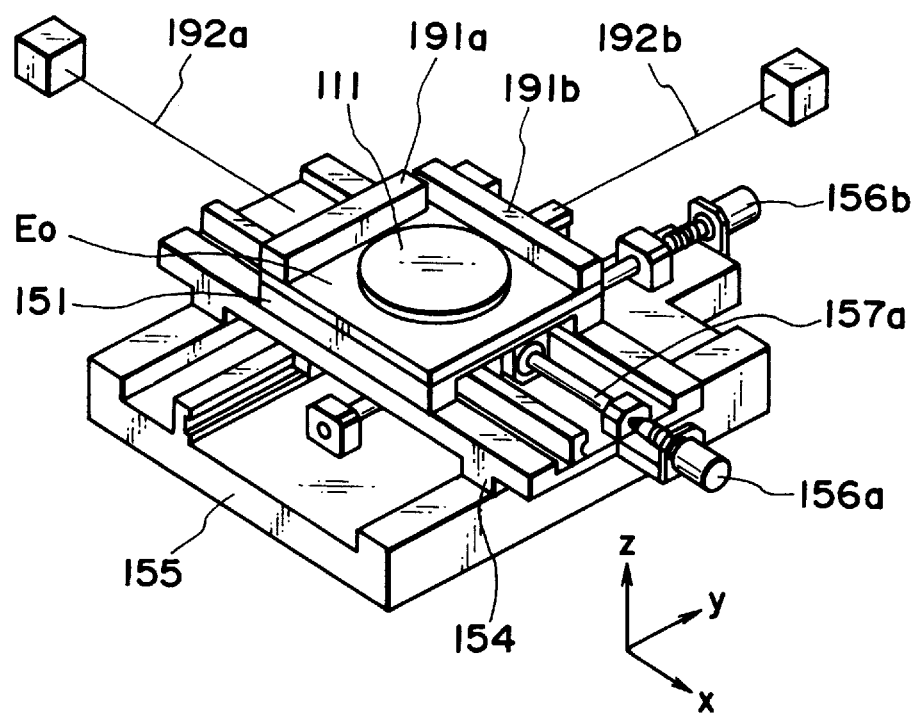
FIG. 15 is a perspective view of a positioning system of known type.
Figure 16:
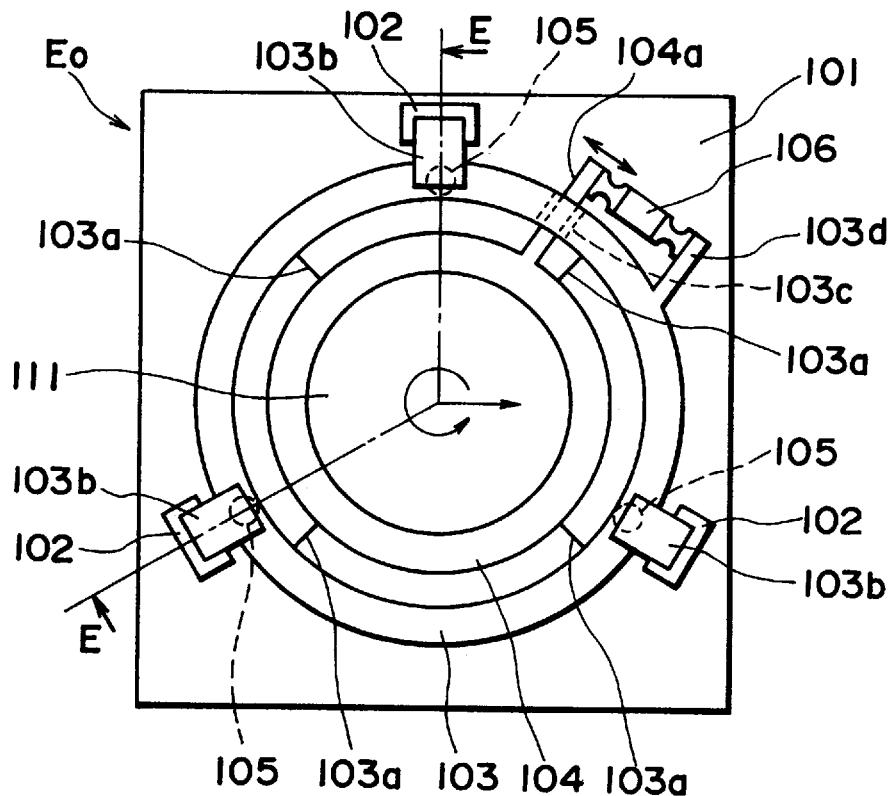
FIG. 16 is a top plan view of a θ-Z-T stage of known type.
Figure 17:
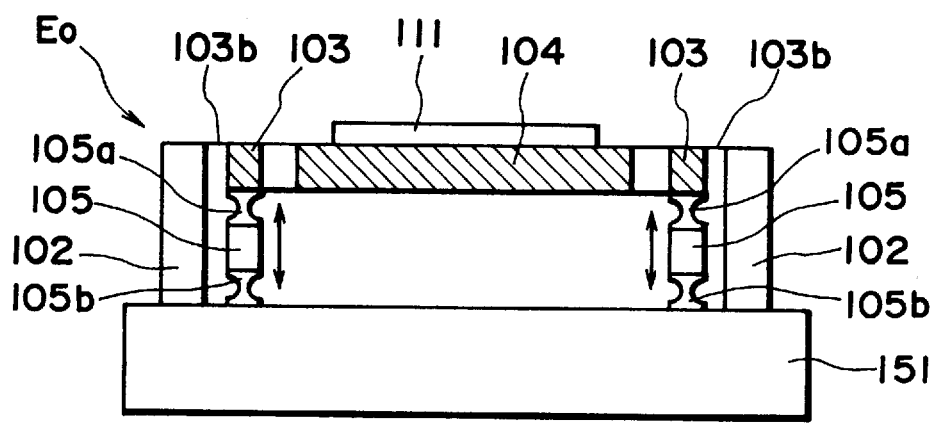
FIG. 17 is a sectional view taken along a line E—E in FIG. 16.

FIG. 14 shows a modified form of the embodiment of FIG. 12. In place of the four supports 21a–21d, there are two supports 31a and 31b which are disposed opposed, in two different directions, to a guiding member 33 similar to the guiding member 23. These two supports 31a and 31b hold thereon small porous material pads 37a and 37b, respectively. Additionally, these supports 31a and 31b are provided with loading permanent magnets 38a–38d each being juxtaposed to the porous pad 37a or 37b. By means of the magnetic attraction forces of these loading permanent magnets 38a–38d, the guiding member 33 is attracted toward the porous pads 37a and 37b. In this modified form, the number of components to be assembled is reduced in accordance with the decrease in the number of supports used. Thus, the production cost is lowered.

In the embodiments of the present invention as described hereinbefore, the Z linear motor may be replaced by a combination of piezoelectric rotation motor and screw or a combination of the former with resilient hinge. Also, the θ linear motor may be replaced by a rotation motor. Further, the actuators for the θ-Z-T stage may be mounted on a bearing mount (not shown) for vertical direction bearings of the X stage. In that case, the overall height can be reduced to a half or smaller of the conventional structure.

The guiding surface of the static bearing means may preferably have a surface roughness not greater than 1s (1 micron). The static bearing means may preferably comprises a porous material having a gas permeability or permeability coefficient not greater than $5\times10^{-16}$ and having a porosity coefficient not greater than 20%.

While the invention has been described with reference to the structures disclosed herein, it is not confined to the details set forth and this application is intended to cover such modifications or changes as may come within the purposes of the improvements or the scope of the following claims.

What is claimed is:

1. A positioning system for moving a holding surface for holding a substrate relative to a base, comprising:

an X-Y stage disposed on the base and being movable in directions of X and Y axes; and a θ-Z-T stage having said holding surface and disposed on said X-Y stage, said θ-Z-T stage being movable in a direction of a Z axis and in rotational directions about the X, Y and Z axes, respectively, wherein said X-Y stage includes a plurality of non-contact static bearings for providing guiding in the directions of X and Y axes, and a plurality of linear motors for moving said θ-Z-T stage in the directions of X and Y axes, and wherein said θ-Z-T stage includes a plurality of non-contact static bearings for providing guiding in the direction of the Z axis and in the rotational directions about the X, Y, and Z axes, respectively, and a plurality of linear motors for moving the holding surface in the direction of the Z axis and in the rotational directions about the X, Y, and Z axes, such that positioning along all the six axes can be performed in non-contact positioning.

2. A system according to claim 1, wherein those of said plurality of non-contact static bearings for providing guiding in the direction of the Z axis and in the rotational directions about the X, Y and X axes, respectively, comprise cylindrical static bearings.

3. A system according to claim 2, wherein said θ-Z-T stage is provided with driving means which comprises at least three actuating elements supported by said X-Y stage.

4. A system according to claim 1, wherein said X-Y stage comprises (i) a Y stage movable along a Y-axis static guiding surface provided on said base, (ii) Y-stage driving means for moving said Y-stage, (iii) an X stage movable with said Y stage and movable along an X-axis static guiding surface provided on said Y stage, and (iv) X-stage driving means for moving said X stage, wherein said X-stage and said Y stage are supported, individually, on said base by static bearing means, with respect to the direction of the Z axis.

5. A device manufacturing apparatus for manufacturing a device by moving a holding surface for holding a substrate relative to a base, comprising:

an X-Y stage disposed on the base and being movable in directions of X and Y axes; and a θ-Z-T stage having said holding surface and disposed on said X-Y stage, said θ-Z-T stage being movable in a direction of a Z axis and in rotational directions about the X, Y and Z axes, respectively;

wherein said X-Y stage includes a plurality of non-contact static bearings for providing guiding the directions of X and Y axes, and a plurality of linear motors for moving said θ-Z-T stage in the directions of X and Y axes, and wherein said θ-Z-T stage includes a plurality of non-contact static bearings for providing guiding in the direction of the Z axis and in the rotational directions about the X, Y, and Z axes, respectively, and a plurality of linear motors for moving the holding surface in the direction of the Z axis and in the rotational directions about the X, Y, and Z axes, such that positioning along all the six axes can be performed in non-contact positioning; and means for performing a device manufacturing process on the substrate held on the holding surface, guided by said plurality of non-contact static bearings, and moved by the plurality of linear motors.

6. An apparatus according to claim 5, wherein said static bearing means comprises a porous throttling type bearing.

7. An apparatus according to claim 6, further characterized by plural driving means associated respectively with motions in the directions of X, Y and Z axes and in the rotational directions about the X, Y and Z axes, respectively, wherein each driving means comprises a linear motor.

8. An apparatus according to claim 5, wherein those of said plurality of non-contact static bearings for providing guiding in the direction of the Z axis and in the rotational directions about the X, Y and Z axes, respectively, comprise cylindrical static bearings, respectively.

9. An apparatus according to claim 8, wherein said θ-Z-T stage is provided with driving means which comprises at least three actuating elements supported by said X-Y stage.

10. An apparatus according to claim 5, wherein said X-Y stage comprises (i) a Y stage movable along a Y-axis static guiding surface provided on said base, (ii) Y-stage driving means for moving said Y stage, (iii) an X stage movable with said Y stage and movable along an X-axis static guiding surface provided on said Y stage, and (iv) X-stage driving means for moving said X stage, wherein said X stage and said Y stage are supported, individually, on said base by static bearing means, with respect to the direction of the Z axis.

11. An apparatus according to claim 5, wherein said static bearing means has a guiding surface with a surface roughness not greater than 1s (1 micron).

12. An apparatus according to claim 6, wherein said static bearing means comprises a porous material having a permeability not greater than $5 \times 10^{-16}$ and a porosity coefficient not greater than 20%.

* * * * *